US012736569B2

(12) United States Patent
Steffens et al.

(10) Patent No.: US 12,736,569 B2
(45) Date of Patent: Sep. 15, 2026

(54) TEST AND/OR MEASUREMENT SYSTEM

(71) Applicant: Rohde & Schwarz GmbH & Co. KG, Munich (DE)

(72) Inventors: Johannes Steffens, Munich (DE); Matthias Ruengeler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 213 days.

(21) Appl. No.: 18/644,473

(22) Filed: Apr. 24, 2024

(65) Prior Publication Data

US 2025/0334623 A1 Oct. 30, 2025

(51) Int. Cl.
*G01R 29/08* (2006.01)

(52) U.S. Cl.
CPC ................................ *G01R 29/0864* (2013.01)

(58) Field of Classification Search
None
See application file for complete search history.

(56) References Cited

U.S. PATENT DOCUMENTS 8,467,746 B2 6/2013 Baumgartner et al.
11,609,343 B2 * 3/2023 El-Assir ................ G01S 19/396
2021/0143918 A1 * 5/2021 Schmid ................ H03F 1/3223

* cited by examiner

*Primary Examiner* — Farhana A Hoque
(74) *Attorney, Agent, or Firm* — CHRISTENSEN O'CONNOR JOHNSON KINDNESS PLLC

(57) ABSTRACT

A test and/or measurement system includes a signal generator circuit, wherein the signal generator circuit includes a processing circuit. The processing circuit is configured to generate and/or process a predetermined waveform, wherein the predetermined waveform includes at least one critical portion. The processing circuit is configured to control the signal generator circuit to generate a radio frequency, RF, signal, based on the predetermined waveform, wherein the generated RF signal includes the predetermined waveform. The processing circuit is configured to adapt operational parameters of the signal generator circuit such that a signal level of the at least one critical portion of the RF signal generated fulfills at least one predefined criterion.

20 Claims, 2 Drawing Sheets

TEST AND/OR MEASUREMENT SYSTEM

FIELD OF THE DISCLOSURE

Embodiments of the present disclosure generally relate to a test and/or measurement system.

BACKGROUND

When configuring electronic communication devices or after the production of the electronic communication devices, measurements have to be performed in order to assess the performance of the electronic communication devices. Usually, the goal of these measurements is to minimize measurement errors by maximizing a signal power level without overloading the device under test or components of the measurement system. This requires a precise leveling of an input signal applied to the device under test.

Some communication standards, e.g. WLAN 802.11, have signal portions that spike in signal power. In order to avoid overload at the ADC, the input signal may have to be attenuated by several dB, which may impair the signal quality and thus the accuracy of the measurement results considerably.

Thus, there is a need for a test and/or measurement system that allows for more precise measurements.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a test and/or measurement system. In an embodiment, the test and/or measurement system comprises a signal generator circuit, wherein the signal generator circuit comprises a processing circuit. In an embodiment, the processing circuit is configured to: generate and/or process a predetermined waveform, wherein the predetermined waveform comprises at least one critical portion; control the signal generator circuit to generate a radio frequency (RF) signal, based on the predetermined waveform, wherein the generated RF signal comprises the predetermined waveform; and/or adapt operational parameters of the signal generator circuit such that a signal level of the at least one critical portion of the RF signal generated fulfills at least one predefined criterion.

As used herein, the term “critical portion of the RF signal” is understood to denote a portion of the RF signal that is relevant for the integrity of data to be transmitted via the RF signal or that is relevant for a figure of merit of a device under test. The term “portion” is understood to denote a segment, for example a connected segment, of the RF signal in time domain and/or in frequency domain. Likewise, the term “uncritical portion of the RF signal” is understood to denote a portion of the RF signal that is not relevant or at least less relevant for the integrity of data to be transmitted via the RF signal.

For example, in the standard WLAN 802.11, the preamble of the RF signal is not relevant for the integrity of the data to be transmitted, but a payload portion of the RF signal is relevant for the integrity of data to be transmitted. Accordingly, in this particular example, the payload portion corresponds to a critical portion of the RF signal, while the preamble corresponds to an uncritical portion of the RF signal.

It is noted that, depending on the communication standard employed, the preamble may also be called a “syncword”, a “sync character”, or a “sync sequence”.

The term “operational parameters of the signal generator circuit” is understood to denote parameters that determine properties of the RF signal generated, such as an amplification factor, an attenuation factor, a power level, a delay, a phase, a frequency of a local oscillator, etc.

The test and/or measurement system according to embodiments of the present disclosure is based on the idea to set a signal level of the RF signal generated by the signal generator circuit based on the knowledge of which portion of the RF signal are critical and which portions are uncritical.

In an embodiment, for setting or adapting the operational parameters of the signal generator circuit, only the critical portion(s) of the RF signal may be taken into account. Accordingly, the signal level of the RF signal can be optimized for the critical portion(s) specifically, such that the accuracy and reliability of measurements performed on a device under test based on the RF signal are enhanced.

In an embodiment, uncritical portions may be discarded or masked for adapting the operational parameters of the signal generator circuit. While this may lead to an overload of the device under test or of other components of the test and/or measurement system when processing the uncritical portions of the RF signal, this does not impact measurements performed on the critical portions.

According to an aspect of the present disclosure, the RF signal generated by the signal generator circuit, for example, is a modulated signal. In an embodiment, the RF signal may be modulated according to a communication standard that is employed by the device under test. Alternatively, the RF signal may be a continuous wave (CW) signal in an embodiment.

In an embodiment of the present disclosure, the signal generator circuit is configured to generate the complete RF signal based on the operational parameters adapted by the processing circuit. In other words, the same operational parameters are used for generating the critical portions and the uncritical portions of the RF signal, i.e. the uncritical portions are not separately leveled. Accordingly, the RF signal may be leveled such that the signal level of the at least one critical portion of the RF signal fulfills the at least one predefined criterion irrespective of whether distortions such as clipping occur in uncritical signal portions.

According to an aspect of the present disclosure, the processing circuit is configured, for example, to apply a signal processing algorithm for equalizing the at least one critical portion. In an embodiment, the processing circuit is configured to apply the signal processing algorithm to the complete predetermined waveform. In other words, the same equalization scheme may be applied to the complete RF signal, i.e. both to the critical portions and to the uncritical portions.

In an embodiment of the present disclosure, the at least one predefined criterion relates to a maximum allowable signal level of the at least one critical portion, a maximum actual signal level of the at least one critical portion, the maximum actual signal level compared to the maximum allowable signal level, a dynamic range of an amplifier processing the RF signal, a dynamic range of an attenuator processing the RF signal, and/or a clipping of the at least one critical portion.

In an embodiment, the at least one predefined criterion may be such that the RF signal is clipping-free in the at least one critical portion. In an embodiment, the at least one predefined criterion may be such that the signal level of the at least one critical portion of the RF signal corresponds to the maximum achievable signal level without clipping or other signal level induced distortions.

According to another aspect of the present disclosure, the signal generator circuit is configured, for example, to generate and output an indicator signal. In an embodiment, the indicator signal indicates that the at least one critical portion is output or that an uncritical portion of the RF signal is output. In general, the indicator signal indicates to components downstream of the signal generator circuit that the currently processed portion of the RF signal is a critical portion or an uncritical portion. Thus, the downstream components may adapt their operational parameters based on the knowledge of which portions of the RF signal are critical and which portions are uncritical, thereby further increasing the accuracy of the measurement results obtained.

For example, operational parameters of a signal analysis circuit provided downstream of the signal generator circuit may be adapted such that an analog-to-digital converter (ADC) of the signal analysis circuit is operated in a nominal operating state for the at least one critical portion of the RF signal, and not in an overloaded operating state.

The term "overload operating state" is understood to denote an operating state of the at least one ADC in which a power level of the RF signal applied to the at least one ADC exceeds an admissible power level of the ADC. This may result in clipping and/or non-linear distortions of the digitized RF signal.

Another aspect of the present disclosure provides, for example, that the processing circuit is configured to identify the at least one critical portion based on at least one of a communication standard underlying the predetermined waveform, a user input, information included in the predetermined waveform, or a command signal received by the signal generator circuit.

Accordingly, the processing circuit may automatically determine which portions of the RF signal are critical portions and which portions of the RF signal are uncritical portions based on the communication standard underlying the RF signal. In general, the communication standard specifies the portions of the RF signal that are used for data transmission and are thus relevant for the integrity of the data to be transmitted.

In an embodiment, the processing circuit may be configured to determine the communication standard on which the RF signal is based, e.g. by demodulating the RF signal or the predetermined waveform. Alternatively or additionally, the processing circuit may have a priori knowledge of the communication standard on which the RF signal is based.

For example, information on the communication standard may be saved in a memory of the test and/or measurement system, and the information on the communication standard may be transmitted to the processing circuit. In another example, a user may input the communication standard via a suitable user interface of the test and/or measurement system. In yet another example, a user may input the critical portion(s) and/or uncritical portion(s) via a user interface of the test and/or measurement system, i.e. the user input may comprise information on which portions are critical portions and/or which portions are uncritical portions. In a further example, the signal generator circuit may receive the command signal that is generated by an external component, i.e. by a component of the test and/or measurement system that is provided separately from the signal generator circuit or from a component that is external to the test and/or measurement system.

In an embodiment, the test and/or measurement system may further comprise a signal analysis circuit configured to generate the command signal and/or a control circuit configured to generate the command signal. For example, a user may mark a portion of a signal analyzed by the signal analysis circuit to be a critical portion by providing a corresponding user input. The signal analysis circuit and/or the control circuit may generate the corresponding command signal based on the user input.

In an embodiment of the present disclosure, the signal generator circuit further comprises at least one amplifier circuit being configured to amplify the RF signal and/or at least one attenuator circuit being configured to attenuate the RF signal, wherein the processing circuit is configured to adapt operational parameters of the signal generator circuit such that at least a predetermined portion of a dynamic range of the at least one amplifier circuit and/or of the at least one attenuator circuit is utilized. Accordingly, a better utilization of the dynamic range of the at least one amplifier circuit and/or of the attenuator circuit is obtained, which may have a positive influence on the accuracy of measurement results obtained by the test and/or measurement system.

For example, the predetermined portion of the dynamic range may be 50% or 75%. As another example, the predetermined portion may correspond to the full dynamic range.

According to an aspect of the present disclosure, the processing circuit is configured, for example, to adapt the operational parameters of the signal generator circuit taking memory effects of the signal generator circuit, memory effects of a device under test, and/or memory effects of a signal analysis circuit into account. In general, memory effects may lead to a cross-talk between an uncritical portion of the RF signal and a critical portion of the RF signal. Accordingly, the operational parameters of the signal generator circuit may be adapted by the processing circuit such that the at least one critical portion of the RF signal generated fulfills the at least one predefined criterion even in the presence of cross-talk due to memory effects.

In an embodiment, the test and/or measurement system may further comprise a signal analysis circuit configured to analyze an output signal of a device under test, thereby obtaining analysis data. In an embodiment, the output signal comprises the predetermined waveform.

In general, a performance of the device under test may be assessed based on the analysis data. For example, the analysis data may comprise a figure of merit of the device under test, such as an error vector magnitude.

In an embodiment, the analysis data may be obtained by the signal analysis circuit only based on the at least one critical portion of the RF signal. Other, uncritical portions of the RF signal may be discarded or masked for obtaining the analysis data.

In another embodiment of the present disclosure, the signal generator circuit is connectable to an input of the device under test. Thus, the RF signal generated by the signal generator circuit may be transmitted to the input of the device under test. The device under test may process the RF signal comprising the predetermined waveform, thereby obtaining an output signal comprising the predetermined waveform. The output signal of the device under test may be analyzed by the signal analysis circuit described above.

In an embodiment, the test and/or measurement system may further comprise a visualization circuit configured to visualize the analysis data. In an embodiment, the visualization circuit is configured to indicate the at least one critical portion. Thus, it is easier for a user to recognize the at least one critical portion, as the at least one critical portion is indicated and thus highlighted in the visualized analysis data.

According to another aspect of the present disclosure, the visualization circuit is configured, for example, to visualize the at least one critical portion different compared to uncritical portions of the predetermined waveform. Thus, it is particularly easy for a user to discern critical portions of the RF signal from uncritical portions of the RF signal.

In an embodiment of the present disclosure, the visualization circuit is configured to visualize the at least one critical portion with a different color and/or shading compared to uncritical portions of the predetermined waveform. However, it is to be understood that the at least one critical portion may be highlighted or indicated in any other suitable way.

A further aspect of the present disclosure provides that the signal analysis circuit is configured, for example, to identify the at least one critical portion based on at least one of a communication standard underlying the predetermined waveform, a user input, information included in the predetermined waveform, or an indicator signal received from the signal generator circuit.

Accordingly, the signal analysis circuit may automatically determine which portions of the output signal are critical portions and which portions of the output signal are uncritical based on the communication standard underlying the output signal of the device under test. In general, the communication standard specifies the portions of the output signal that are used for data transmission and are thus relevant for the integrity of the data to be transmitted.

In an embodiment, the signal analysis circuit may be configured to determine the communication standard on which the output signal is based, e.g. by demodulating the output signal. Alternatively or additionally, the signal analysis circuit may have a priori knowledge of the communication standard on which the output signal is based.

For example, a user may input the communication standard via a suitable user interface of the test and/or measurement system. As another example, a user may input the critical portion(s) and/or uncritical portion(s) via a user interface of the test and/or measurement system, i.e. the user input may comprise information on which portions of the output signal are critical portions and/or which portions of the output signal are uncritical portions. In a further example, the signal analysis circuit may receive the indicator signal generated by the signal generator circuit as described above. Due to the indicator signal indicating whether a critical or an uncritical portion of the RF signal was output to the DUT, the signal analysis circuit can immediately deduce whether the respective portion of the output signal of the DUT is a critical portion or an uncritical portion.

In an embodiment, the test and/or measurement system may comprise a test and/or measurement instrument having a housing, wherein the signal generator circuit and the signal analysis circuit each are arranged in the housing. Accordingly, the test and/or measurement instrument comprises both the signal generator circuit and the signal analysis circuit. For example, the test and/or measurement instrument may be a network analyzer, a vector network analyzer, an oscilloscope, or another type of measurement instrument with built-in signal generator circuit.

Alternatively, the test and/or measurement system may comprise a first test and/or measurement instrument having a first housing and a second test and/or measurement instrument having a second housing, wherein the first housing and the second housing are separate from each other, wherein the signal generator circuit is arranged in the first housing, and wherein the signal analysis circuit is arranged in the second housing. Accordingly, two separate test and/or measurement instruments may be provided that may both be connected to the device under test and that cooperate in order to analyze the performance of the device under test.

According to another aspect of the present disclosure, the signal analysis circuit is configured, for example, to determine at least one figure of merit of the output signal. For example, the at least one figure of merit may comprise an error vector magnitude (EVM). However, it is to be understood that the at least one figure of merit may comprise any other suitable quantity, for example a signal-to-noise ratio, a noise figure, etc.

In another embodiment of the present disclosure, the at least one critical portion corresponds to a payload portion. In other words, the at least one critical portion may comprise data to be transmitted.

According to a further aspect of the present disclosure, at least one uncritical portion of the predetermined waveform corresponds, for example, to a preamble. In contrast to the payload portion, the preamble typically does not contain data to be transmitted and is thus not relevant for assessing the integrity of the transmitted data. Accordingly, the preamble can be discarded or masked for adapting the operational parameters of the signal generator circuit.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figures 1, 2:
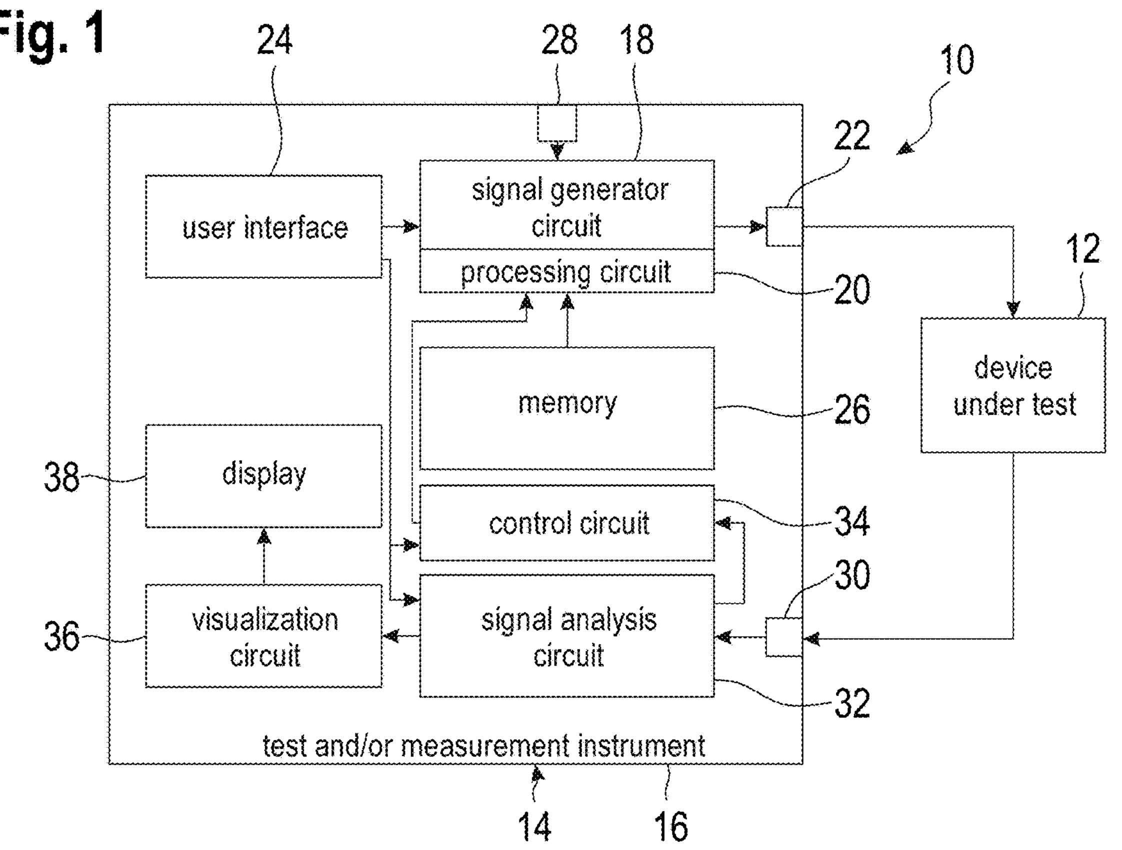
FIG. 1 schematically shows an example of a test and/or measurement system according to an embodiment of the present disclosure.
FIG. 2 schematically shows visualization data obtained by the test and/or measurement system according to one or more embodiments of the present disclosure.

FIG. 1 schematically shows an example of a test and/or measurement system 10 according to an embodiment of the present disclosure. As shown in FIG. 1, the system 10 comprises a device under test 12 and a test and/or measurement instrument 14. In general, the device under test 12 is configured to process an RF signal and to generate an output signal based on the RF signal.

For example, the device under test 12 may be established as a wireless communication device, such as a mobile phone, a tablet, a wireless transceiver, a WLAN router, etc. The device under test 12 may employ any suitable wireless communication standard, e.g. WLAN, Bluetooth, near field communication (NFC), LTE, 5G, etc.

As a further example, the device under test 12 may be established as an electronic component, such as an amplifier, an attenuator, a mixer, a filter, etc.

The test and/or measurement instrument 14 is configured to generate the RF signal and to analyze the output signal of the device under test 12 in order to assess a performance of the device under test 12. The RF signal generated may be a modulated signal, for example wherein the RF signal is modulated according to a communication standard that is employed by the device under test 12. However, in another embodiment, the RF signal generated may be a continuous wave (CW) signal.

In an embodiment, the test and/or measurement instrument 14 may be a spectrum analyzer, a signal analyzer, an oscilloscope, a network analyzer, or a vector network analyzer. However, it is to be understood that the test and/or measurement instrument 14 may be established as any other suitable type of test and/or measurement device.

In an embodiment, the test and/or measurement instrument 14 comprises a housing 16 that encloses the components described hereinafter.

In the embodiment of FIG. 1, the test and/or measurement instrument 14 comprises a signal generator circuit 18 having a processing circuit 20. The test and/or measurement instrument 14 also comprises at least one output port 22 that is connected to an input of the device under test 12.

In general, the signal generator circuit 18 is configured to generate the RF signal that is output to the device under test 12 via the at least one output port 22. For example, the processing circuit 20 is configured to process and/or generate a predetermined waveform. The processing circuit 20 further is configured to adapt operational parameters of the signal generator circuit 18 such that the signal generator circuit 18 generated the RF signal comprising the predetermined waveform.

In an embodiment, the predetermined waveform comprises at least one critical portion, i.e. at least one portion that is relevant for the integrity of data to be transmitted via the RF signal or that is particularly relevant for assessing a performance of the device under test 12. Of course, the predetermined waveform may comprise a plurality of critical portions. In an embodiment, the predetermined waveform may also comprise at least one uncritical portion, for example a plurality of uncritical portions.

In an embodiment, the the processing circuit 20 is configured to set and adapt the operational parameters of the signal generator circuit 18 such that a signal level of the at least one critical portion of the RF signal generated fulfills at least one predefined criterion. In other words, the RF signal generated by the signal generator circuit 18 is leveled based on a knowledge of the at least one critical portion of the predetermined waveform, such that the at least one critical portion fulfills the at least one predefined criterion.

In an embodiment, the at least one predefined criterion may relate to a maximum allowable signal level of the at least one critical portion, a maximum actual signal level of the at least one critical portion, the maximum actual signal level compared to the maximum allowable signal level, a dynamic range of an amplifier processing the RF signal, a dynamic range of an attenuator processing the RF signal, and/or a clipping of the at least one critical portion. In an embodiment, the at least one predefined criterion may be such that the RF signal is clipping-free in the at least one critical portion.

In an embodiment, the at least one predefined criterion may be such that the signal level of the at least one critical portion of the RF signal corresponds to the maximum achievable signal level without clipping or other signal level induced distortions. Alternatively or additionally, the at least one predefined criterion may be such that at least a predetermined portion of a dynamic range of at least one amplifier circuit of the signal generator circuit 18 processing the RF signal and/or of the at least one attenuator circuit of the signal generator circuit 18 processing the RF signal is utilized.

For example, the predetermined portion of the dynamic range may be 50% or 75%. As another example, the predetermined portion may correspond to the full dynamic range.

In an embodiment, the processing circuit 20 may set and adapt the operational parameters of the signal generator circuit 18 taking memory effects in the signal generator circuit 18 or in any components downstream of the signal generator circuit 18 into account. For example, the operational parameters of the signal generator circuit 18 may be adapted by the processing circuit 20 such that the at least one critical portion of the RF signal generated fulfills the at least one predefined criterion even in the presence of cross-talk between critical and uncritical portions due to the memory effects.

In an embodiment, the processing circuit 20 is configured to apply a signal processing algorithm for equalizing the at least one critical portion. Based on the signal processing algorithm, the processing circuit 20 adapts the operational parameters of the signal generator circuit 18 such that the at least one critical portion fulfills the at least one predefined criterion. In an embodiment, the processing circuit 20 is configured to apply the signal processing algorithm to the complete predetermined waveform, such that the complete RF signal is generated based on the operational parameters adapted by the processing circuit 20.

As already mentioned above, the RF signal is leveled by the processing circuit 20 based on a knowledge of which portions of the RF signal are critical and which portions of the RF signal are uncritical. This knowledge may be based on one or several of the example described hereinafter.

According to an embodiment, the predetermined waveform may be generated by the processing circuit 20 itself, namely based on a communication standard underlying the predetermined waveform. The communication standard may determine which portions of an RF signal are critical portions and which portions are uncritical portions. In an embodiment, the communication standard underlying the RF signal to be generated may be input by a user via a user interface 24 of the test and/or measurement instrument 14.

Alternatively or additionally, the communication standard underlying the RF signal to be generated may be saved in a memory 26 of the test and/or measurement instrument 14, and may be forwarded from the memory 26 to the processing circuit 20. The memory 26 may be a non-transitory memory.

Alternatively or additionally, the communication standard underlying the RF signal to be generated may be received from an external electronic device via an external input 28 of the test and/or measurement instrument 14. For example, the external electronic device may be a personal computer, a laptop, a tablet, a smartphone, or another type of smart device.

According to another embodiment, the predetermined waveform may be received and processed by the processing circuit 20. For example, the predetermined waveform may be input by a user via the user interface 24 of the test and/or measurement instrument 14. As another example, the predetermined waveform may be stored in the memory 26 of the test and/or measurement instrument 14, and may be forwarded from the memory 26 to the processing circuit 20. In a further example, the predetermined waveform may be received from the external electronic device via the external input 28 of the test and/or measurement instrument 14.

In an embodiment, the predetermined waveform may comprise information on the communication standard underlying the predetermined waveform. Accordingly, the processing circuit 20 may determine the communication standard underlying the predetermined waveform based on the predetermined waveform, for example by demodulating the predetermined waveform.

In use, the device under test 12 receives and processes the RF signal generated by the signal generator circuit 18, thereby obtaining an output signal. The output signal comprises the predetermined waveform. The output signal is forwarded to an input port 30 of the test and/or measurement instrument 14 that is connected to the device under test 12.

In the example embodiment shown in FIG. 1, the output signal of the device under test 12 may be an electrical signal, and the input port 30 may be connected to the device under test 12 via a cable. However, it is to be understood that the output signal of the device under test 12 may also be a wireless signal. In this case, an RF antenna may be connected to the input port 30, such that the wireless output signal is received by the RF antenna and forwarded to the input port 30.

In an embodiment, the test and/or measurement instrument 14 further comprises a signal analysis circuit 32 that is connected to the input port 13 so as to receive the output signal of the device under test 12. In general, the signal analysis circuit 32 is configured to analyze the output signal of the device under test 12, thereby obtaining analysis data. For example, the analysis data may comprise at least one figure of merit of the device under test 12, such as an error vector magnitude (EVM).

In an embodiment, the signal analysis circuit 32 may identify the at least one critical portion of the output signal of the device under test 12 based on a communication standard underlying the predetermined waveform, a user input received via the user interface 24, information included in the predetermined waveform, or on indicator signal received from the signal generator circuit 18.

Accordingly, the signal analysis circuit 32 may automatically determine which portions of the output signal are critical portions and which portions of the output signal are uncritical based on the communication standard underlying the output signal of the device under test 12.

In an embodiment, the signal analysis circuit 32 may be configured to determine the communication standard on which the output signal is based, e.g. by demodulating the output signal. Alternatively or additionally, the signal analysis circuit may have a priori knowledge of the communication standard on which the output signal is based.

For example, a user may input the communication standard via the user interface 24 of the test and/or measurement instrument 14. As another example, a user may input the critical portion(s) and/or uncritical portion(s) via the user interface 24, i.e. the user input may comprise information on which portions of the output signal are critical portions and/or which portions of the output signal are uncritical portions.

In a further example, the signal analysis circuit 32 may receive an indicator signal generated by the signal generator circuit 18. In general, the indicator signal indicates that the at least one critical portion is output by the signal generator circuit 18, or that an uncritical portion of the RF signal is output by the signal generator circuit 18.

Based on the knowledge of the at least one critical portion, the analysis circuit 32 may adapt its operational parameters such that an optimal analysis of the at least one critical portion of the output signal is ensured. For example, the operational parameters of a signal analysis circuit 32 may be adapted such that an analog-to-digital converter (ADC) of the signal analysis circuit 32 is operated in a nominal operating state for the at least one critical portion of the output signal of the device under test 12, and not in an overloaded operating state.

In the example embodiment shown in FIG. 1, the test and/or measurement instrument 14 further comprises a control circuit 34 that is connected to the signal analysis circuit 32. The control circuit 34 may be configured to generate a command signal based on the analysis data and/or based on a user input received via the user interface 24. For example, a user may mark a portion of signal analysis data obtained by the signal analysis circuit 32 to be a critical portion by providing a corresponding user input via the user interface 24.

In an embodiment, the command signal may be transmitted to the processing circuit 20, which may adapt the operational parameters of the signal generator circuit 18 based on the command signal. Accordingly, the measurements on the device under test 12 described above may be repeated with the portion of the RF signal marked by the user being a critical signal portion. It is noted that the command signal may, alternatively or additionally, be generated by the signal analysis circuit 32.

In an embodiment, the test and/or measurement instrument 14 further comprises a visualization circuit 36 that is connected to the signal analysis circuit 32. In general, the visualization circuit 36 is configured to generate visualization data based on the analysis data. The visualization data may be displayed on a display 38 of the test and/or measurement instrument 14 and/or on an external display connected to the test and/or measurement instrument 14.

FIG. 2 shows an example of visualization data obtained based on the analysis data. The visualization data may comprise a plot 40 of the output signal of the device under test 12 over time. In this example, the output signal may be a WLAN signal that may be based on a WLAN standard like WLAN 802.11. As is illustrated in FIG. 2, this standard comprises a preamble with rather high peaks and a payload portion with a substantially flat maximum signal power level.

In general, the visualization circuit 36 may be configured to indicate the at least one critical portion in the visualization data, such that the at least one critical portion is illustrated differently compared to uncritical portions. Alternatively or additionally, the visualization circuit 36 may be configured to indicate at least one uncritical portion of the output signal of the device under test 12.

In the example shown in FIG. 2, the visualization data may comprise first boxes 42 having a first color, e.g. orange, brown, or red, if the respective portion of the output signal corresponds to an uncritical portion. The visualization data may further comprise second boxes 44 having a second color, e.g. green or yellow, if the respective portion of the output signal corresponds to an uncritical portion. Instead or in addition to the different colors, the visualization data may comprise different shadings.

In the example embodiment shown in FIG. 2, the visualization data further comprises markers 46 indicating signal portions in which the RF signal or the output signal has overloaded at least one component of the test and/or measurement system 10. In an embodiment, the markers 46 may be colored makers and may have different colors depending on whether the overloaded portion corresponds to a critical portion or to an uncritical portion.

In an example, the visualization data may comprise traffic light indicators, i.e. a green color may indicate no overload at all, a yellow color may indicate a soft overload, i.e. an overload in an uncritical portion, and a red color may indicate a hard overload, i.e. an overload in a critical portion of the RF signal.

Figure 3:
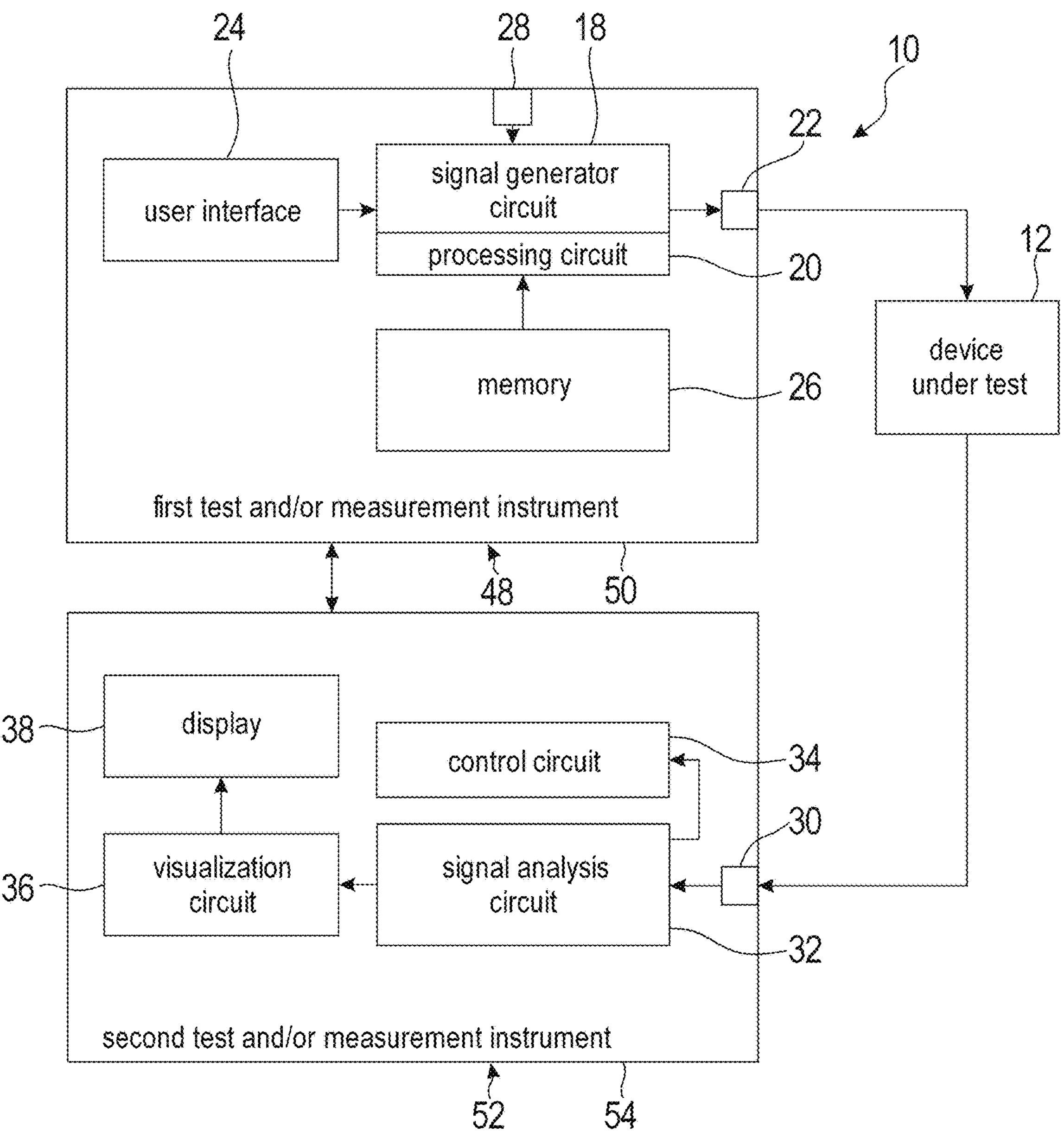
FIG. 3 schematically shows an example of a test and/or measurement system according to another embodiment the present disclosure.

FIG. 3 shows another example of the test and/or measurement system 10. This example of the system 10 is substantially similar in construction and operation to the system 10 described above with respect to FIG. 1 except for the differences that are explained hereinafter.

In the embodiment of FIG. 3, The test and/or measurement system comprises a first test and/or measurement instrument 48 having a first housing 50, as well as a second test and/or measurement instrument 52 having a second housing 54. The first test and/or measurement instrument 48 may be a signal generator or another type of test and/or measurement instrument having an integrated signal generator circuit. The second test and/or measurement instrument 52 may be a spectrum analyzer, a signal analyzer, an oscilloscope, a network analyzer, or a vector network analyzer.

The first test and/or measurement instrument 48 comprises the signal generator circuit 18 with the processing circuit 20, the memory 26, the user interface 24, the output port 22, and the external input 28. The second test and/or measurement instrument 52 comprises the input port 30, the signal analysis circuit 32, the control circuit 34, the visualization circuit 36, and the display 38.

It is to be understood that individual components and circuits may be interchanged between the first test and/or measurement instrument 48 and the second test and/or measurement instrument 52. Further, it is noted that individual components and circuits may be provided in both the first test and/or measurement instrument 48 and the second test and/or measurement instrument 52. For example, both test and/or measurement instruments 48, 52 may comprise a memory, a user interface and/or a display.

In an embodiment, the first test and/or measurement instrument 48 and the second test and/or measurement instrument 52 may be connected to each other, e.g. via suitable ports and cables, such that signals can be exchanged between the test and/or measurement instruments 48, 52. For example, the command signal described above, the indicator signal described above, and/or user inputs received by the user interface 24 may be exchanged between the test and/or measurement instruments 48, 52.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

Of course, in an embodiment, two or more of these components, or parts thereof, can be integrated or share hardware and/or software, circuitry, etc. In an embodiment, these components, or parts thereof, may be grouped in a single location or distributed over a wide area. In circumstances where the components are distributed, the components are accessible to each other via communication links.

In an embodiment, one or more of the components, such as system 10, the DUT 12, etc., referenced above include circuitry programmed to carry out one or more functions described herein. In an embodiments, one or more computer-readable media associated with or accessible by such circuitry contains computer readable instructions embodied thereon that, when executed by such circuitry, cause the component or circuitry to perform one or more functions disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible to a computing device, such as processor circuitry, etc., or other circuitry disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In an embodiment, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test and/or measurement system, comprising:

a signal generator circuit comprising a processing circuit, wherein the processing circuit is configured to:

generate and/or process a predetermined waveform, wherein the predetermined waveform comprises at least one critical portion;

control the signal generator circuit to generate a radio frequency, RF, signal, based on the predetermined waveform, wherein the generated RF signal comprises the predetermined waveform and has at least one critical portion as well as at least one uncritical portion, wherein the at least one critical portion of the RF signal is relevant for the integrity of data to be transmitted via the RF signal or for a figure of merit of a device under test, and wherein the at least one uncritical portion of the RF signal is less relevant for the integrity of the data to be transmitted via the RF signal or for said figure of merit than the at least one critical portion of the RF signal; and adapt operational parameters of the signal generator circuit such that a signal level of the at least one critical portion of the RF signal generated fulfills at least one predefined criterion, wherein the at least one predefined criterion relates to a maximum achievable signal level of the RF signal causing no clipping and/or no other signal level induced distortions in the at least one critical portion of the RF signal.

2. The test and/or measurement system of claim 1, wherein the signal generator circuit is configured to generate the complete RF signal based on the operational parameters adapted by the processing circuit.

3. The test and/or measurement system of claim 1, wherein the processing circuit is configured to apply a signal processing algorithm for equalizing the at least one critical portion, wherein the processing circuit is configured to apply said signal processing algorithm to the complete predetermined waveform.

4. The test and/or measurement system of claim 1, wherein the at least one predefined criterion relates to a maximum allowable signal level of the at least one critical portion, a maximum actual signal level of the at least one critical portion, the maximum actual signal level compared to the maximum allowable signal level, a dynamic range of an amplifier processing the RF signal, a dynamic range of an attenuator processing the RF signal, and/or a clipping of the at least one critical portion.

5. The test and/or measurement system of claim 1, wherein the signal generator circuit is configured to generate and output an indicator signal, and wherein the indicator signal indicates that the at least one critical portion is output, or wherein the indicator signal indicates that an uncritical portion of the RF signal is output.

6. The test and/or measurement system of claim 1, wherein the processing circuit is configured to identify the at least one critical portion based on at least one of a communication standard underlying the predetermined waveform, a user input, information included in the predetermined waveform, or a command signal received by the signal generator circuit.

7. The test and/or measurement system of claim 6, further comprising a signal analysis circuit configured to generate the command signal and/or a control circuit configured to generate the command signal.

8. The test and/or measurement system of claim 1, wherein the signal generator circuit further comprises at least one amplifier circuit being configured to amplify the RF signal and/or at least one attenuator circuit being configured to attenuate the RF signal, wherein the processing circuit is configured to adapt operational parameters of the signal generator circuit such that at least a predetermined portion of a dynamic range of the at least one amplifier circuit and/or of the at least one attenuator circuit is utilized.

9. The test and/or measurement system of claim 1, wherein the processing circuit is configured to adapt the operational parameters of the signal generator circuit taking memory effects of the signal generator circuit, memory effects of a device under test, and/or memory effects of a signal analysis circuit into account.

10. The test and/or measurement system of claim 1, further comprising a signal analysis circuit, wherein the signal analysis circuit is configured to analyze an output signal of a device under test, thereby obtaining analysis data, wherein the output signal comprises the predetermined waveform.

11. The test and/or measurement system of claim 10, wherein the signal generator circuit is connectable to an input of the device under test.

12. The test and/or measurement system of claim 10, further comprising a visualization circuit, wherein the visualization circuit is configured to visualize the analysis data, and wherein the visualization circuit is configured to indicate the at least one critical portion.

13. The test and/or measurement system of claim 12, wherein the visualization circuit is configured to visualize the at least one critical portion different compared to uncritical portions of the predetermined waveform.

14. The test and/or measurement system of claim 13, wherein the visualization circuit is configured to visualize the at least one critical portion with a different color and/or shading compared to uncritical portions of the predetermined waveform.

15. The test and/or measurement system of claim 10, wherein the signal analysis circuit is configured to identify the at least one critical portion based on at least one of a communication standard underlying the predetermined waveform, a user input, information included in the predetermined waveform, or an indicator signal received from the signal generator circuit.

16. The test and/or measurement system of claim 10, comprising a test and/or measurement instrument having a housing, wherein the signal generator circuit and the signal analysis circuit each are arranged in the housing.

17. The test and/or measurement system of claim 10, comprising a first test and/or measurement instrument having a first housing and a second test and/or measurement instrument having a second housing, wherein the first housing and the second housing are separate from each other, wherein the signal generator circuit is arranged in the first housing, and wherein the signal analysis circuit is arranged in the second housing.

18. The test and/or measurement system of claim 10, wherein the signal analysis circuit is configured to determine at least one figure of merit of the output signal.

19. The test and/or measurement system of claim 1, wherein the at least one critical portion corresponds to a payload portion.

20. The test and/or measurement system of claim 1, wherein at least one uncritical portion of the predetermined waveform corresponds to a preamble.

* * * * *